United States Patent [19]
Messmer et al.

[11] Patent Number: 6,002,584
[45] Date of Patent: Dec. 14, 1999

[54] HEAT PROTECTIVE ENCLOSURE AND HEAT PROTECTED ELECTRONIC DEVICE

[75] Inventors: Helmut Messmer, Volkertshausen; Wolfgang Kummle, Salem-Beuren, both of Germany

[73] Assignee: Bodenseewerk Gerätetechnik GmbH, Germany

[21] Appl. No.: 09/079,308

[22] Filed: May 14, 1998

[30] Foreign Application Priority Data

May 17, 1997 [DE] Germany ............................ 197 20 842

[51] Int. Cl.[6] ........................................................ H05K 7/20
[52] U.S. Cl. ........................... 361/690; 361/692; 361/704; 361/707; 361/708; 361/720; 174/15.1; 174/16.1; 174/17 VA; 174/52.2; 454/184; 454/369
[58] Field of Search ................................. 361/690, 692, 361/704, 705, 707, 714, 720, 721; 174/16.1, 16.3, 252, 17 R, 17 VA, 52.2; 454/184, 369

[56] References Cited

U.S. PATENT DOCUMENTS

| | | | |
|---|---|---|---|
| 4,433,732 | 2/1984 | Licht et al. | 169/48 |
| 4,483,908 | 11/1984 | Zimmerman | 429/8 |
| 4,493,173 | 1/1985 | Kohaut | 52/220.8 |
| 4,694,119 | 9/1987 | Groenewegen | 174/52.2 |
| 4,729,916 | 3/1988 | Feldman | 428/182 |
| 4,879,320 | 11/1989 | Hastings | 523/179 |
| 4,944,401 | 7/1990 | Groenewegen | 206/521 |
| 5,398,467 | 3/1995 | Ricq et al. | 52/232 |
| 5,565,274 | 10/1996 | Perrone, Jr. et al. | 428/457 |
| 5,681,640 | 10/1997 | Kiser | 428/181 |
| 5,782,690 | 7/1998 | Gustafson et al. | 454/369 |
| 5,810,919 | 9/1998 | Olzak et al. | 174/522 |
| 5,811,731 | 9/1998 | Jacques et al. | 174/68.3 |

FOREIGN PATENT DOCUMENTS

| | | |
|---|---|---|
| 1135065 | 6/1960 | Germany . |
| 1135065 | 8/1962 | Germany . |
| 7505337 | 8/1975 | Germany . |
| 3927198 | 2/1991 | Germany . |
| 2151410 | 9/1984 | United Kingdom ............. H05K 7/20 |
| 2151410 | 7/1985 | United Kingdom ............. H05K 7/20 |
| 2218719 | 11/1989 | United Kingdom ............. E04B 1/94 |
| 2293208 | 3/1996 | United Kingdom ............ E05G 1/024 |
| WO9322814 | 11/1993 | WIPO . |

*Primary Examiner*—Leo P. Picard
*Assistant Examiner*—Boris L. Chervinsky
*Attorney, Agent, or Firm*—Mallinckrodt & Mallinckrodt

[57] ABSTRACT

In a high-temperature protective arrangement for an electronic device, which as such generates heat, the electronic device is enclosed by a heat protective enclosure provided with gaps for permitting heat removal by air convection. The heat protective enclosure is coated with a material which is subject to swelling under the action of heat to a multiple of the thickness of the original coating whereby a heat-insulating layer is formed and the gaps are closed. Electronic components of the electronic device are disposed within a housing. The heat generated by the electronic components is passed to the housing which is surrounded at a spacing substantially on all sides by the heat protective enclosure.

12 Claims, 1 Drawing Sheet

6,002,584

HEAT PROTECTIVE ENCLOSURE AND HEAT PROTECTED ELECTRONIC DEVICE

BACKGROUND OF THE INVENTION

The present invention relates to a new and improved construction of a heat protective enclosure for an electronic device.

The present invention also relates to a new and improved construction of a heat protected electronic device.

More specifically, the present invention relates to a new and inventive construction of a heat protective enclosure as well as an electronic device protected by such enclosure against the action of high temperature such as produced on the exterior, for example, by a fire. In such arrangement, the electronic device is disposed within a housing which is surrounded by the heat protective enclosure.

Frequently there exists the necessity of maintaining full operability of the electronic device at least for a limited period of time even under the action of strong heat such as caused, for example, by an external fire. This is particularly true for critical security devices located in environments exposed to a fire hazard such as fuel storages or aircraft drive motors or engines. It is frequently impossible placing such electronic devices outside of the environment which is exposed to the fire hazard.

Protection from the action of strong heat possibly may be effected by heat insulation. For this purpose, insulating materials might be applied to an electronic device. The electronic device also might be disposed in an additional housing which is fire-protected.

A heat protected electronic device of the aforementioned type is known, for example, from British Published Patent Application No. 2,151,410A, published on Jul. 17, 1985, and is used in connection with the flight data memory unit of an aircraft. Therein, a mechanically resistant protective shell is provided with an internal liner made of a material which has a high melting point and low thermal conductivity. Printed circuit boards supporting solid-state memory devices are arranged within the liner and are preferably surrounded by a further shell. The high-temperature melting material of low thermal conductivity melts only at temperatures of about 1100° C. and maintains the flight data memory unit at a temperature below or up to about 200° C. for more than 4 hours even under the action of a fire.

This known heat protected electronic device permits heat insulation against the action of strong heat from the exterior. Many electronic devices, however, generate heat loss to an extent such that removal of the thus produced heat becomes indispensable. Preventing the heat removal by means of insulating material or a fire protective housing, will induce the risk of self-overheating of the electronic device. Moreover, a fire protective housing may be accompanied by an increase in space requirement and weight of the electronic device. This represents a serious disadvantage particularly in connection with the use thereof in an aircraft.

In order to remove the heat produced during normal operation of an electronic device, it is known, for example, from German Patent Publication No. 1,135,065, published on Aug. 23, 1962, to connect the chassis of the electronic device to a housing which is provided with air passage openings in the bottom wall and in the side walls. The cross-sectional area of the passage openings in the bottom wall is controlled by means of a bimetal-controlled plate. In this manner there is generated a cooling air flow through the housing in adaptation to the heat generated by the electronic device itself. Also, it is known from German Utility Model No. 7,505,337, published on Aug. 14, 1975, to provide supports, into which printed circuit boards are inserted, with aeration slots at their upper and lower surfaces.

SUMMARY OF THE INVENTION

Therefore, with the foregoing in mind, it is a primary object of the present invention to provide a new and improved construction of a heat protective enclosure for an electronic device and an electronic device, which is heat protected by such enclosure, which constructions are not afflicted with the drawbacks and limitations of the prior art heretofore discussed.

Another and more specific object of the present invention relates to a new and improved construction of a heat protective enclosure which, while permitting removal of heat from an electronic device which is enclosed therein and generates heat during its normal operation, likewise protects the electronic device from external action of strong heat like from a fire, at least for a limited period of time.

A highly significant object of the present invention is directed to the provision of a new and improved construction of a heat protected electronic device and which construction, on the one hand, permits sufficient removal of heat generated during normal operation of the electronic device while providing protection from the action of strong heat from the exterior, on the other hand.

A very important object of the present invention is directed to providing a new and improved construction of a heat protected electronic device and which construction protects the electronic device from the action of strong external heat such as produced, for example, by a fire, at least for a limited period of time.

A still particularly significant object of the present invention resides in providing a new and improved construction of a heat protected electronic device for use in an aircraft and which construction includes a heat protective enclosure permitting removal of heat during normal operation of the electronic device while protecting the electronic device from the external action of strong heat like from a fire, at least for a limited period of time.

Now, in order to implement these and still further objects of the invention, which will become more readily apparent as the description proceeds, the heat protective enclosure according to the present development is manifested by the features that, among other things, the heat protective enclosure for a heat loss producing electronic device is provided with gaps for permitting removal of the thus produced heat by means of air convection. The heat protective enclosure is coated with a material which swells or expands under the action of strong heat to form a heat insulating layer having a thickness, which is a multiple of the original coating thickness, and closing the aforenoted gaps.

As illuded to above, the present invention is not only concerned with the new and improved construction of a heat protective enclosure but also to a new and improved construction of a heat protected electronic device. In order to achieve the aforementioned objects, the heat protected electronic device comprises a support for at least one electronic component which produces heat loss during its normal operation, and a housing which accommodates the support and the at least one electronic component and which enables removal of the heat generated during normal operation of the a least one electronic component. The housing is surrounded at a predetermined spacing by a heat protective enclosure which is provided with gaps for enabling air convection therethrough for heat removal from the housing and the heat-generating electronic device accommodated therein. The heat protective enclosure is coated with a material which is subject to expansion under the action of strong heat with the formation of a heat insulating layer which closes the gaps.

In this manner a heat removing air convection occurs during normal operation of the electronic device. Due to the action of strong heat such as produced, for example, externally by a fire, the coating material swells to a multiple of its original thickness as a consequence of a chemical reaction. The gaps are thereby closed. Furthermore, the swollen material forms a fire-retarding insulating layer which protects the electronic device from the action of external heat at least for a predetermined, limited period of time. While the heat generated by the electronic device, then, will no longer be removed during this time, it will usually still take some further time before the function of the electronic device is impaired due to self-overheating. In fact, it has been found that an effective high temperature protection can be achieved for the electronic device in connection with the inventive heat protective enclosure.

For preventing the propagation of fire in buildings, particularly due to the chimney effect caused by aeration passages which are provided in the roof construction of the buildings, it has been suggested in German Published Patent Application No. 3,927,198, published on Feb. 21, 1989, that the aeration passages be subdivided into an upper aeration channel and a lower aeration channel by means of an intermediate web. The intermediate web is provided with strip-shaped pieces which extend parallel to the eaves and which are made of a material subject to foaming under the action of heat. In the event of a fire inside the building, the strips of material expand with foaming whereby the lower as well as the upper aeration channels are closed and the undesired chimney effect is prevented.

Advantageously, the inventive heat protective enclosure is made of perforated sheet metal which may be coated on both sides with the heat-expanding material.

In a preferred embodiment of the present invention, the heat generated by the electronic device is passed to the housing of the electronic device. The housing is surrounded substantially on all sides at a predetermined spacing by the heat protective enclosure which is made of perforated sheet metal and coated by the material which expands under the action of heat in the aforedescribed manner.

BRIEF DESCRIPTION OF THE DRAWINGS

The invention will be better understood and objects other than those set forth above, will become apparent when consideration is given to the following detailed description thereof. Such description makes reference to the annexed drawings wherein the same or analogous components are designated by the same reference numerals and wherein.

DETAILED DESCRIPTION OF THE PREFERRED EMBODIMENTS

Describing now the drawings, it will be understood that only enough of the construction of the inventive heat protective enclosure as well as the inventive heat protected electronic device has been shown as needed for those skilled in the art to readily understand the underlying principles and concepts of the present development, while simplifying the showing of the drawings.

Figure 1:
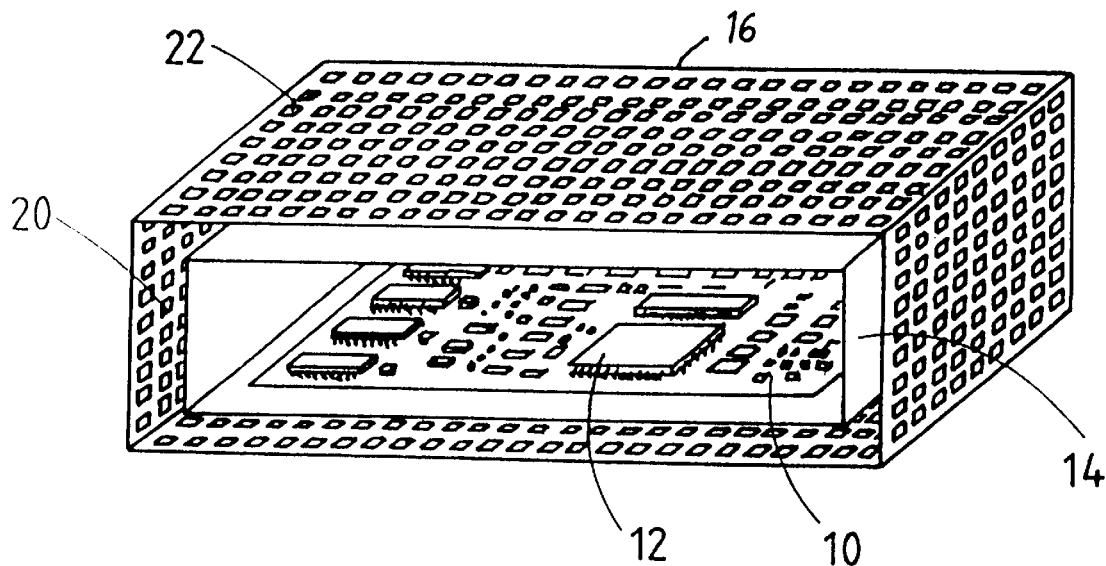
FIG. 1 is a cut-away illustration in perspective of an exemplary embodiment of the invention showing an electronic device provided with a heat protective enclosure.

With reference to FIG. 1, there has been shown in a cut-away perspective view, an exemplary embodiment of the inventive heat protected electronic device generally designated by the reference numeral 10. The electronic at least one electronic component 12. In the illustrated embodiment, the printed circuit board supports a multiple number of electronic components 12 such as semiconductor components, power transistors, and passive or active components or the like at least one of which generate heat during its normal operation. The electronic device 10 is accommodated in a housing 14 which, for example, is made of a metal like aluminum or fiber-reinforced plastic. The heat generated during normal operation of the electronic components 12 is passed to the housing 14 in known manner by thermal conduction and/or heat radiation.

Figure 2:
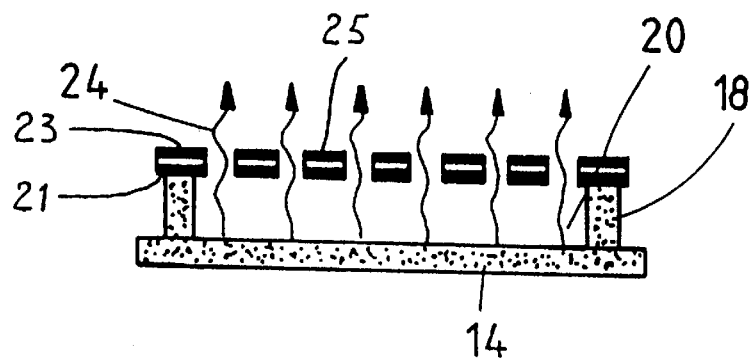
FIG. 2 is a cross-sectional illustration of a top part of the heat-protected electronic device as shown in FIG. 1 and explains the effect of the heat protective enclosure during normal operation of the electronic device.
Figure 3:
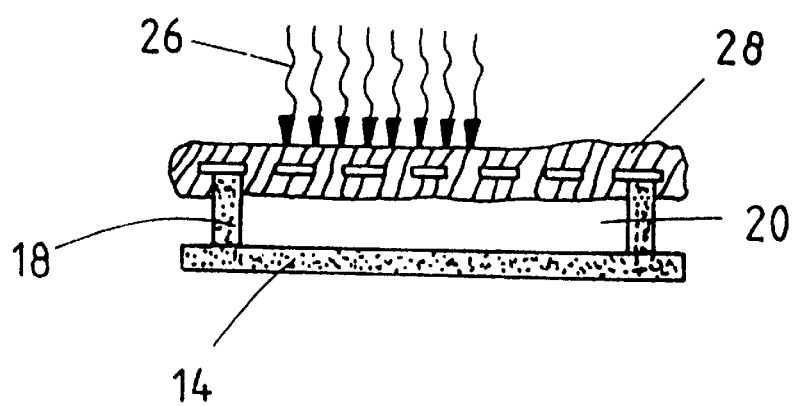
FIG. 3 is a cross-sectional illustration of the top part of the heat-protected electronic device as shown in FIG. 2 and explains the effect of the heat protective enclosure under the action of strong external heat.

The housing 14 is surrounded by a heat protective enclosure 16, preferably substantially on all sides. As indicated in FIGS. 2 and 3, the heat protective enclosure 16 is held at a predetermined spacing from the housing 14 by means of spacers 18, again preferably substantially on all sides. An intermediate space is thus defined between the housing 14 and the heat protective enclosure 16. The heat protective enclosure 16 is made of, for example, a metal like steel or aluminum or a plastic material which is reinforced by means of glass or carbon fibers. As indicated in the Figures of the drawing, the heat protective enclosure 16 is provided with gaps 22. Also, the heat protective enclosure defines an inner surface 21, which faces the housing 14, as well as an outer surface 23, which is remote from the housing 14. At least one of the inner surface 21 and the outer surface 23 is provided with a coating 25 made of a material which is capable of swelling or expanding due to a chemical reaction which is initiated by strong heat such as external heat caused by a fire, for example. Coating materials of such type are known in the aircraft and spacecraft construction technology.

As will be evident from FIG. 2, the gaps 22 provided in the heat protective enclosure 16, enable air flow or air convection therethrough and thereby heat removal from the housing 14 and the electronic device 10 which generates heat during its normal operation. This is indicated in FIG. 2 by arrows 24.

Under the action of external strong heat as produced, for example, by a fire and as indicated in FIG. 3 by arrows 26, the coating 25 which is applied to the heat protective enclosure 16, swells or expands as also illustrated in FIG. 3. As a result, the swollen or expanded material forms a thick heat insulating layer 28 which has a thickness representing a multiple of the thickness of the original coating 25 and which closes the gaps 22 provided in the heat protective enclosure 16. There is thus produced a continuous, closed heat insulating layer 28 which surrounds the housing 14 with the formation of an intermediate space 20. Due to such intermediate space 20, an air space of heat-insulating nature is defined.

In this condition, i.e. in the presence of the heat insulating layer 28, the electronic device 10 is shielded from the action of heat at least for a limited period of time. While the internally generated heat, then, is no longer removed by air convection in this condition, the electronic device 10 still retains its full operability for some time until its function is impaired due to self-overheating. As already noted hereinbefore, heat removal is virtually unimpaired during normal operation, i.e. in the absence of strong heat and prior to expansion of the original coating 25. The advantages of the invention will be particularly recognized when considering, for example, the heat protection of electronic engine controls which are conventionally mounted directly at an aircraft engine.

The heat protective enclosure 16 is of a light-weight nature and only little additional space is required for its installation. The only additional space requirement results from the spacing between the housing 14 and the heat protective enclosure 16.

While there are shown and described present preferred embodiments of the invention, it is to be distinctly understood that the invention is not limited thereto, but may be otherwise variously embodied and practiced within the scope of the following claims. Accordingly,

What we claim is:

1. A heat protective enclosure for an electronic device, comprising:

an enclosure provided with gaps enabling air convection therethrough;

said enclosure defining an inner surface and an outer surface;

said enclosure including a coating of a material which, under the action of strong heat, is subject to expansion with the formation of a heat insulating layer having a thickness, which is a multiple of the thickness of said coating, and closing said gaps; and said enclosure being provided with said coating on at least one of said inner surface and said outer surface.

2. The enclosure as defined in claim 1, further including spacer elements for holding said enclosure at a predetermined spacing from a device to be enclosed by said enclosure.

3. The enclosure as defined in claim 1, wherein said enclosure is made of perforated sheet metal.

4. The enclosure as defined in claim 1, wherein the enclosure is made of fiber-reinforced plastic.

5. A heat protected electronic device, comprising:

at least one electronic component which generates heat during its normal operation;

a housing accommodating said at least one heat generating electronic component;

said housing enabling removal of the heat generated during normal operation of said at least one electronic component;

a heat protective enclosure surrounding said housing at a predetermined spacing;

said heat protective enclosure being provided with gaps enabling air convection from said housing therethrough;

said heat protective enclosure defines an inner surface, which faces said housing, and an outer surface remote from said housing;

said heat protective enclosure including a coating of a material which, under the action of strong heat, is subject to expansion with the formation of a heat insulating layer having a thickness, which is a multiple of the thickness of said coating, and closing said gaps; and at least one of said inner surface and said outer surface being coated with said coating.

6. The heat protected electronic device as defined in claim 5, further including:

a printed circuit board; and said printed circuit board supporting said at least one heat generating electronic component.

7. The heat protected electronic device as defined in claim 5, wherein:

said housing is made of a heat-conductive material; and said at least one heat generating electronic component being in heat conductive contact with said housing.

8. The heat protected electronic device as defined in claim 5, wherein:

said housing is made of a heat conductive material; and said heat generated during normal operation of said at least one electronic component, is transmitted as heat radiation received by said housing.

9. The heat protected electronic device as defined in claim 5, further including spacer elements holding said heat protective enclosure at a predetermined spacing from said electronic device.

10. The heat protected electronic device as defined in claim 9, wherein said heat protective enclosure encloses said electronic device at said predetermined spacing substantially on all sides.

11. The heat protected electronic device as defined in claim 5, wherein said heat protective enclosure is made of perforated sheet metal.

12. The heat protected electronic device as defined in claim 5, wherein said heat protective enclosure is made of fiber-reinforced plastic.

* * * * *